United States Patent
Lu

(10) Patent No.: US 11,158,740 B2
(45) Date of Patent: Oct. 26, 2021

(54) MOSFETS WITH MULTIPLE DISLOCATION PLANES

(71) Applicant: Taiwan Semiconductor Manufacturing Company, Ltd., Hsinchu (TW)

(72) Inventor: Wei-Yuan Lu, Taipei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 16/388,488

(22) Filed: Apr. 18, 2019

(65) Prior Publication Data

US 2019/0245077 A1    Aug. 8, 2019

Related U.S. Application Data

(63) Continuation of application No. 15/837,381, filed on Dec. 11, 2017, now Pat. No. 10,269,967, which is a
(Continued)

(51) Int. Cl.
*H01L 29/78* (2006.01)
*H01L 21/265* (2006.01)
(Continued)

(52) U.S. Cl.
CPC ...... *H01L 29/785* (2013.01); *H01L 21/26506* (2013.01); *H01L 21/26586* (2013.01);
(Continued)

(58) Field of Classification Search
CPC .................. H01L 21/265; H01L 29/033; H01L 29/66477; H01L 29/848
See application file for complete search history.

(56) References Cited

U.S. PATENT DOCUMENTS 6,605,845 B1 * 8/2003 Liang .................. H01L 21/2815
257/368
7,410,876 B1    8/2008 Min et al.
(Continued)

FOREIGN PATENT DOCUMENTS

| CN | 1790734 A | 6/2006 |
| CN | 102468164 A | 5/2012 |
| CN | 103066124 A | 4/2013 |

OTHER PUBLICATIONS

Packan, P., et al., "High Performance 32nm Logic Technology Featuring 2nd Generation High-k + Metal Gate Transistors," 2009 IEEE International Electron Devices Meeting (IEDM), Dec. 7-9, 2009, pp. 28.4.1-28.4.4.

*Primary Examiner* — Wael M Fahmy
*Assistant Examiner* — Quinton A Brasfield
(74) *Attorney, Agent, or Firm* — Slater Matsil, LLP

(57) ABSTRACT

A method includes forming a metal-oxide-semiconductor field-effect transistor (MOSFET). The Method includes performing an implantation to form a pre-amorphization implantation (PAI) region adjacent to a gate electrode of the MOSFET, forming a strained capping layer over the PAI region, and performing an annealing on the strained capping layer and the PAI region to form a dislocation plane. The dislocation plane is formed as a result of the annealing, with a tilt angle of the dislocation plane being smaller than about 65 degrees.

20 Claims, 16 Drawing Sheets

Related U.S. Application Data continuation of application No. 15/082,250, filed on Mar. 28, 2016, now Pat. No. 9,853,157, which is a continuation of application No. 14/455,102, filed on Aug. 8, 2014, now Pat. No. 9,299,838, which is a continuation-in-part of application No. 13/280,094, filed on Oct. 24, 2011, now Pat. No. 8,809,918.

(51) Int. Cl.

| | | |
|---|---|---|
| H01L 21/322 | (2006.01) | |
| H01L 29/32 | (2006.01) | |
| H01L 29/66 | (2006.01) | |
| H01L 29/10 | (2006.01) | |
| H01L 21/762 | (2006.01) | |
| H01L 29/04 | (2006.01) | |
| H01L 29/08 | (2006.01) | |

(52) U.S. Cl.
CPC .... *H01L 21/3221* (2013.01); *H01L 21/76232* (2013.01); *H01L 29/04* (2013.01); *H01L 29/045* (2013.01); *H01L 29/0847* (2013.01); *H01L 29/1079* (2013.01); *H01L 29/32* (2013.01); *H01L 29/66628* (2013.01); *H01L 29/7833* (2013.01); *H01L 29/7834* (2013.01); *H01L 29/7843* (2013.01); *H01L 29/7847* (2013.01); *H01L 29/7848* (2013.01)

(56) References Cited

U.S. PATENT DOCUMENTS

| | | |
|---|---|---|
| 8,754,477 B2 | 6/2014 | Lu et al. |
| 2003/0227057 A1 | 12/2003 | Lochtefeld et al. |
| 2006/0014366 A1 | 1/2006 | Currie |
| 2006/0118892 A1* | 6/2006 | Wu ............... H01L 21/76829 257/412 |
| 2008/0237723 A1 | 10/2008 | Wei et al. |
| 2008/0280391 A1 | 11/2008 | Shin et al. |
| 2010/0038685 A1 | 2/2010 | Weber |
| 2010/0210086 A1 | 8/2010 | Wang et al. |
| 2011/0027956 A1 | 2/2011 | Domenicucci et al. |
| 2012/0061736 A1* | 3/2012 | Yin .................. H01L 29/78 257/288 |
| 2012/0104486 A1 | 5/2012 | Yin et al. |
| 2013/0037822 A1* | 2/2013 | Yin .............. H01L 21/26506 257/77 |
| 2013/0099314 A1* | 4/2013 | Lu ................ H01L 29/41783 257/347 |
| 2013/0323894 A1 | 12/2013 | Yin et al. |
| 2014/0346576 A1 | 11/2014 | Lu et al. |
| 2015/0364570 A1* | 12/2015 | van Meer ........ H01L 29/6659 438/305 |

\* cited by examiner

MOSFETS WITH MULTIPLE DISLOCATION PLANES

PRIORITY CLAIM AND CROSS-REFERENCE

This application is a continuation of U.S. patent application Ser. No. 15/837,381, entitled "MOSFETs with Multiple Dislocation Planes," filed Dec. 11, 2017, which is a continuation of U.S. patent application Ser. No. 15/082,250, entitled "MOSFETs with Multiple Dislocation Planes," filed Mar. 28, 2016 now U.S. Pat. No. 9,853,157 issued Dec. 26, 2017, which is a continuation of U.S. patent application Ser. No. 14/455,102, entitled "MOSFETs with Multiple Dislocation Planes," filed Aug. 8, 2014, now U.S. Pat. No. 9,299,838 issued Mar. 29, 2016 which is a continuation-in-part application of the following U.S. Patent application: application Ser. No. 13/280,094, filed Oct. 24, 2011, and entitled "MOSFETs with Multiple Dislocation Planes," now U.S. Pat. No. 8,809,918 issued Aug. 19, 2014, which applications are hereby incorporated herein by reference.

BACKGROUND

To enhance the performance of metal-oxide-semiconductor (MOS) devices, stresses may be introduced into the channel regions of the MOS devices to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction. Techniques for improving the stresses in the MOS devices are thus explored.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
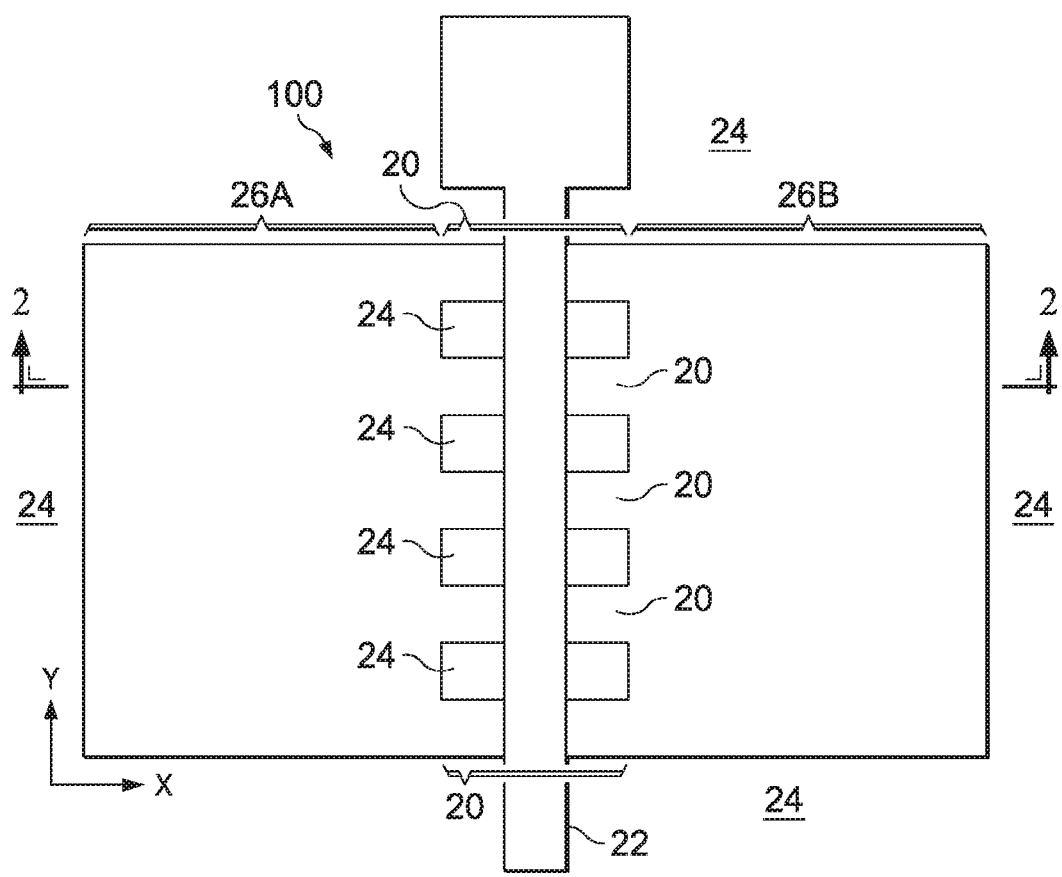
FIG. 1 illustrates a top view of a metal-oxide-semiconductor field-effect transistor (MOSFET)

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A metal-oxide-semiconductor field-effect transistor (MOSFET) and the method of forming the same are provided in accordance with various embodiments. The intermediate stages of forming the MOSFET are illustrated. The variations and the operation of the embodiments are discussed. Throughout the various views and illustrative embodiments, like reference numbers are used to designate like elements.

FIG. 1 illustrates a top view of n-type MOSFET 100 in accordance with various embodiments. MOSFET 100 is a tri-gate MOSFET (sometimes known as a FinFET), and includes at least one, and possibly more, semiconductor fins 20. Semiconductor fins 20 are spaced apart from each other, with insulation regions (which may be shallow trench isolation (STI) regions) 24 therebetween. Gate electrode 22 is formed on semiconductor fins 20 and covers the top surfaces of semiconductor fins 20. Gate electrode 22 also wraps round the sidewalls of semiconductor fins 20. Bulk active regions 26 are on the opposite ends of semiconductor fins 20, wherein bulk active region 26A interconnects portions of semiconductor fins 20 on the left side of gate electrode 22. Bulk active region 26B interconnects portions of semiconductor fins 20 on the right side of gate electrode 22.

Figure 2:
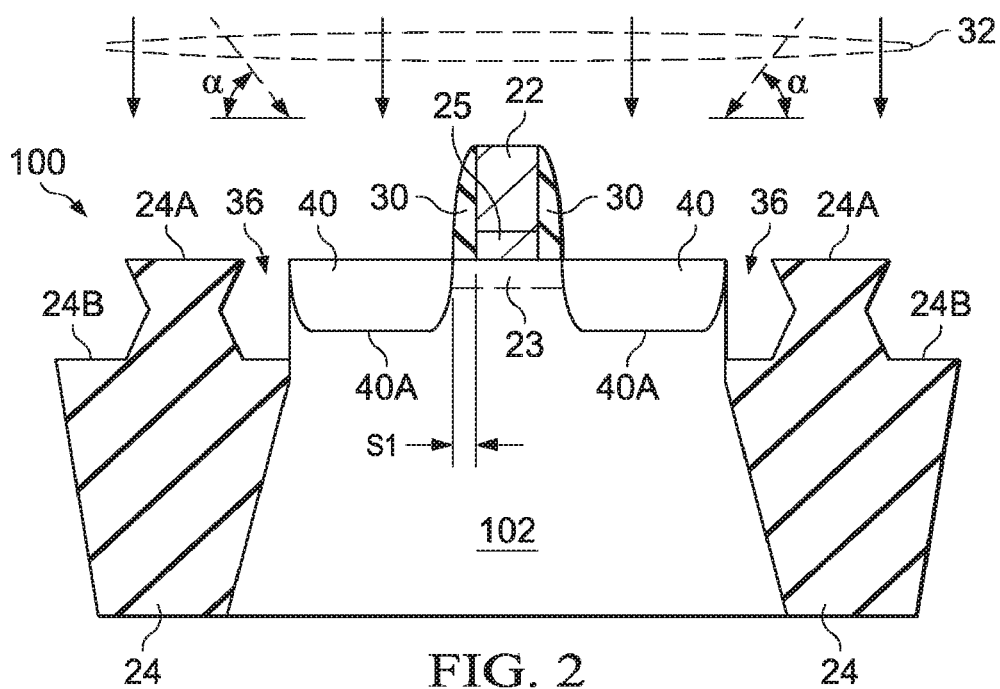
FIGS. 2 through 11 are cross-sectional views of intermediate stages in the manufacturing of the MOSFET in accordance with various embodiments.

FIGS. 2 through 11 are cross-sectional views of intermediate stages in the manufacturing of n-type MOSFET 100 in accordance with some embodiments. The cross-sectional views are taken from the plane crossing line 2-2 In FIG. 1. Referring to FIG. 2, semiconductor substrate 102 is provided, and STI regions 24 are formed to extend from the top surface of semiconductor substrate 102 into semiconductor substrate 102. Semiconductor substrate 102 may be a silicon substrate, a silicon germanium substrate, or may comprise other semiconductor materials such as III-V compound semiconductor materials. On the sidewall of gate electrode 22 and gate electrode 25, main offset spacers 30 are optionally formed. Main offset spacers 30 may be formed of a dielectric material such as silicon oxide, although other dielectric materials such as silicon nitride, silicon oxynitride, or the like may also be used. STI regions 24 comprise recesses 36, which are formed by recessing the portions of STI regions 24 that adjoin semiconductor substrate 102. Accordingly, STI regions 24 have top surfaces 24A and recessed top surfaces 24B, with recessed top surfaces 24B lower than top surfaces 24A. The portions of substrate 102 that are over recessed top surfaces 24B thus form semiconductor fins 20 (please refer to FIG. 1) and bulk semiconductor regions 26A and 26B (FIG. 1). In some embodiments, recesses 36 may encircle semiconductor fins 20 and bulk semiconductor regions 26A and 26B. Channel region 23 is thus formed in semiconductor substrate 102, and is under gate electrode 22.

A first pre-amorphization implantation (PAI, also sometimes referred to as pre-amorphous implantation), as symbolized by arrows 32, is then performed. In some embodiment, silicon or germanium is implanted. In other embodiments, inert gases such as neon, argon, xenon, and radon are implanted. The pre-amorphization implantation destroys the lattice structure of semiconductor substrate 102. When germanium is implanted, the implantation energy may be between about 25 keV and about 40 keV, and the implantation dosage may be between about $1E14/cm^2$ and about $1E15/cm^2$. The implantation may be performed when semiconductor substrate 102 is at a temperature between about −60° C. and about −100° C. in some exemplary embodiments.

After the first PAI, exposed top portions of semiconductor substrate 102, which portions include semiconductor fins 20 and bulk semiconductor regions 26A and 26B are turned into an amorphous state as a result of the PAI. PAI regions 40 are thus formed. In an embodiment, the implantation is performed vertically. In alternative embodiments, the implantation may be performed at tilt angles α, which may be smaller than about 20 degrees. When the tilt implantation is performed, two tilt implants may be performed and tilt to opposite directions, as illustrate by dashed arrows 32.

The bottom surface 40A of PAI regions 40 may be higher than recessed top surfaces 24B of STI regions 24 to ensure that dislocation pinch-off lines 48 (FIG. 3) are higher than recessed STI top surfaces 24B. When the vertical implantation is performed and when no offset spacer 30 is formed, the inner edges of PAI regions 40 may be substantially aligned to edges of gate electrode 22 (so that distance S1 is substantially equal to zero nm). Alternatively, PAI regions 40 may be spaced apart from the respective closest edge of gate electrode 22 by distance S1, which is a non-zero value. On the other hand, when the tilt implantation is performed, PAI regions 40 may, or may not, extend to directly under gate electrode 22.

Figure 3:
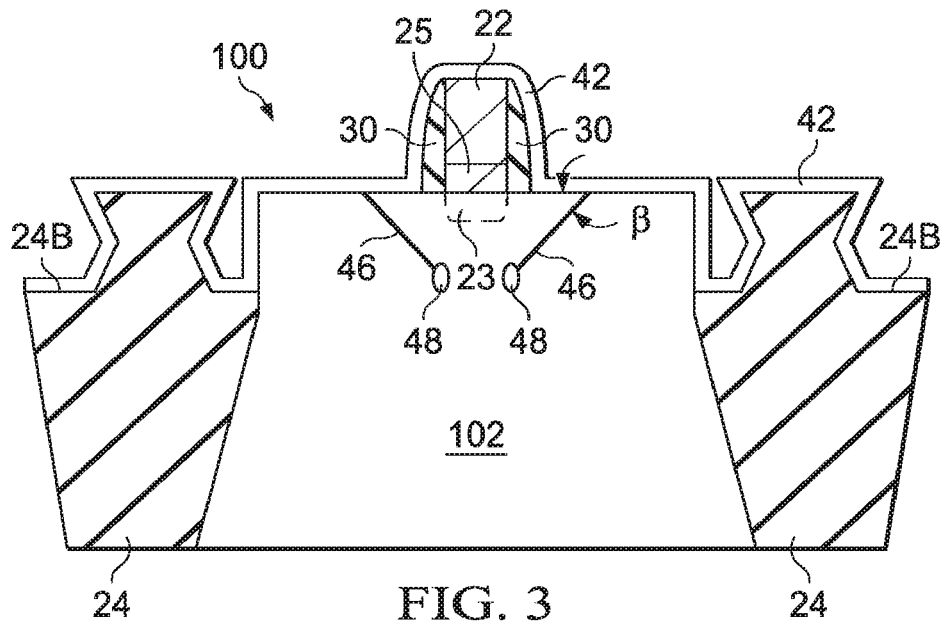

FIG. 3 illustrates the formation of a first strained capping layer 42. The materials of strained capping layer 42 may include silicon nitride, titanium nitride, oxynitride, oxide, SiGe, SiC, SiON, and combinations thereof. Strained capping layer 42 may have an inherent tensile stress. The formation process is adjusted to change the stress to a desirable value. In some embodiments, strained capping layer 42 includes a single layer. In other embodiments, strained capping layer 42 may have a laminated structure with multiple layers.

In accordance with some embodiments, in the process gases for forming strained capping layer 42, there is no hydrogen contained. For example, when strained capping layer 42 comprises silicon nitride, the process gases may include silane ($SiH_4$) (or $SiCl_4$) and ammonia ($NH_3$), while no hydrogen or substantially no hydrogen is added. In the resulting strained capping layer 42, no hydrogen or substantially no hydrogen is included.

An anneal is then performed, for example, using rapid thermal anneal (RTA), thermal spike RTA anneal, or other anneal methods. In an embodiment, the anneal is performed using spike RTA, with the annealing temperature between about 950° C. and about 1050° C., for about 3 ms to 5 seconds, for example. In alternative embodiments, the anneal may be performed using long time RTA, with a anneal temperature between about 550° C. and about 950° C., for a duration between about ten seconds and about five minutes, for example. As a result of the anneal, PAI regions 40 as in FIG. 2 are recrystallized with a memorized stress obtained from strained capping layer 42. Accordingly, semiconductor substrate 102 may apply a tensile stress to channel region 23 of the resulting MOSFET 100, so that the drive current of MOSFET 100 is improved.

As the result of the annealing, dislocation planes 46 are formed. Although illustrated as lines in the cross-sectional view shown in FIG. 3, dislocation planes 46 are planes that extend in the longitudinal direction of gate electrode 22, which is also the Y direction in FIG. 1. The bottom points 48 of dislocation planes 46 may be higher than recessed top surfaces 24B of STI regions 24. This may minimize the impact of STI regions 24, which adversely apply compressive stress to channel 23. Bottom points 48 form lines extending in the Y direction in FIG. 1, and hence are referred to as pinch-off lines 48 hereinafter.

In accordance with some embodiments, dislocation planes 46 form an angle β with a horizontal plane parallel to a major top or bottom surface of substrate 102. Angle β may be in the range of about 45 degrees to about 90 degrees, and may be between about 50 degrees and about 60 degrees. In accordance with some exemplary embodiments, angle β is about 55 degrees.

Figure 4:
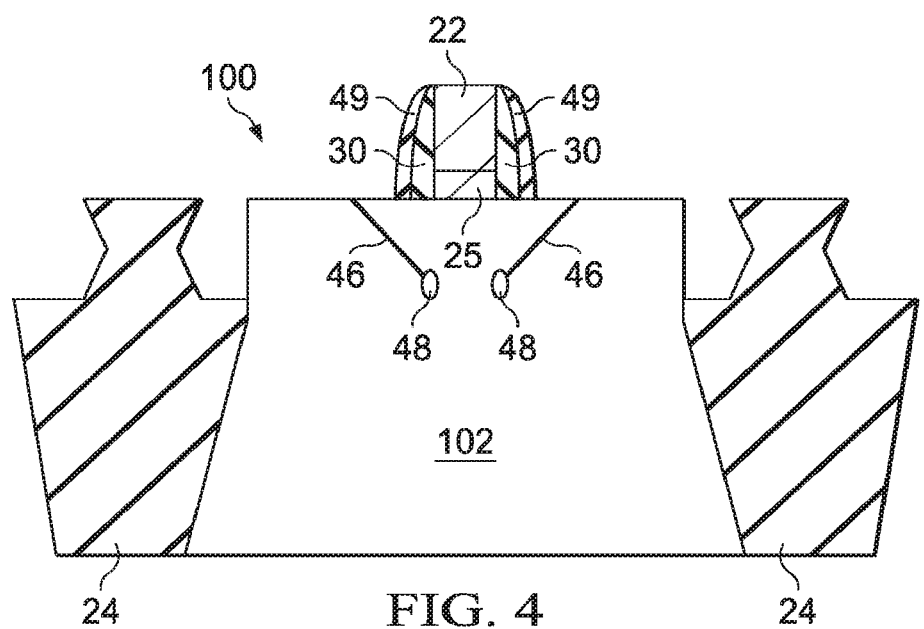

Next, referring to FIG. 4, an etch step is performed, and the horizontal portions of strained capping layer 42 are removed, while some of the vertical portions of strained capping layer 42 remain. Remaining portions of strained capping layer 42 are referred to as offset spacers 49 hereinafter. Offset spacers 49 are on the sidewalls of main offset sidewall spacers 30, or on the sidewalls of gate electrode 22 if main offset sidewall spacers 30 are not formed. It is noted that the remaining portions of strained capping layer 42 may also include portions on the sidewalls of substrate 102 and STI regions 24, and these portions are not illustrated.

Figure 5:
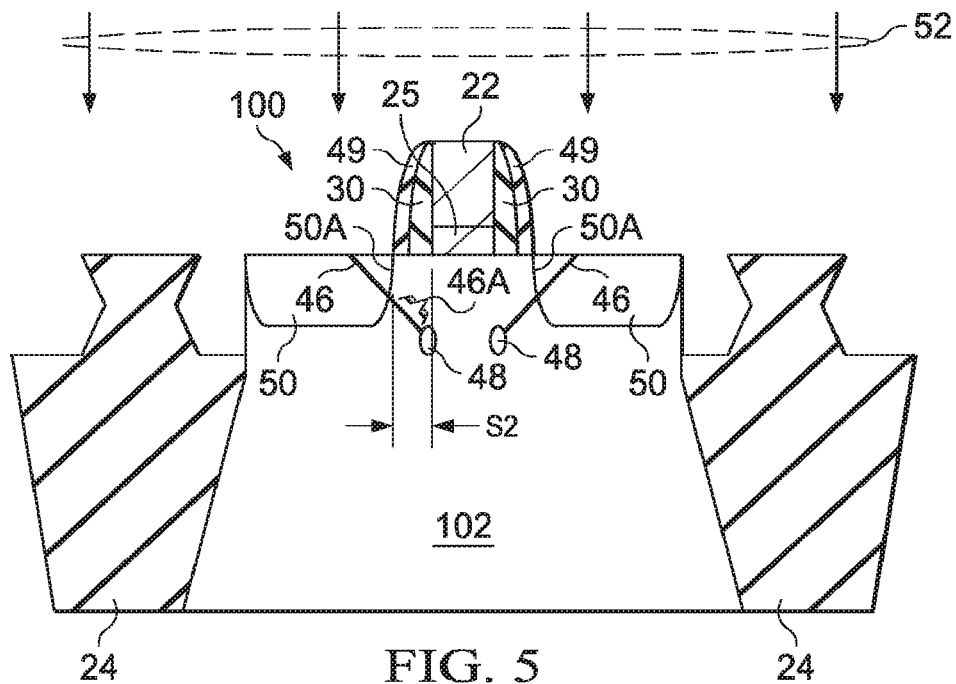

FIG. 5 illustrates the formation of second PAI regions 50 through a second PAI implantation, which PAI implantation is illustrated using arrows 52. The second PAI implantation is performed with offset spacers 49 blocking some of the implanted elements. Accordingly, inner edges 50A of PAI regions 50 are farther away from the respective gate electrode 22 than the respective PAI regions 40 (FIG. 2). Alternatively stated, horizontal spacing S2, which is the spacing between the inner edges of PAI regions 50 and the respective nearest edges of gate electrode 22, is greater than horizontal spacing S1 in FIG. 2. Furthermore, at least a bottom portion 46A of each of dislocation planes 46 is not located inside the newly formed PAI regions 50. This may be achieved by making PAI regions 50 shallower than pinch-off lines 48. Alternatively, this may be achieved by using offset spacers 49 in the second PAI to space PAI regions 50 away from gate electrode 22, as illustrated in FIG. 5. The crystalline structure in the portions of dislocation planes 46 that overlap PAI regions 50 are destroyed since PAI regions 50 are amorphous regions. The second PAI may be formed vertically, or tilted using a tilt angle equal to or smaller than tilt angle α (FIG. 2) of the first PAI implantation. This may ensure that the subsequent formed dislocation planes 56 (FIG. 6) do not overlap dislocation planes 46. The implanted element may be selected from the similar available elements that may be used by the first PAI. When germanium is implanted, the implantation energy may be between about 15 keV and about 50 keV, and the implantation dosage may be between about $1E14/cm^2$ and about $1E15/cm^2$. The implantation may be performed when semiconductor substrate 102 is at a temperature between about −60° C. and about −100° C.

Figure 6:
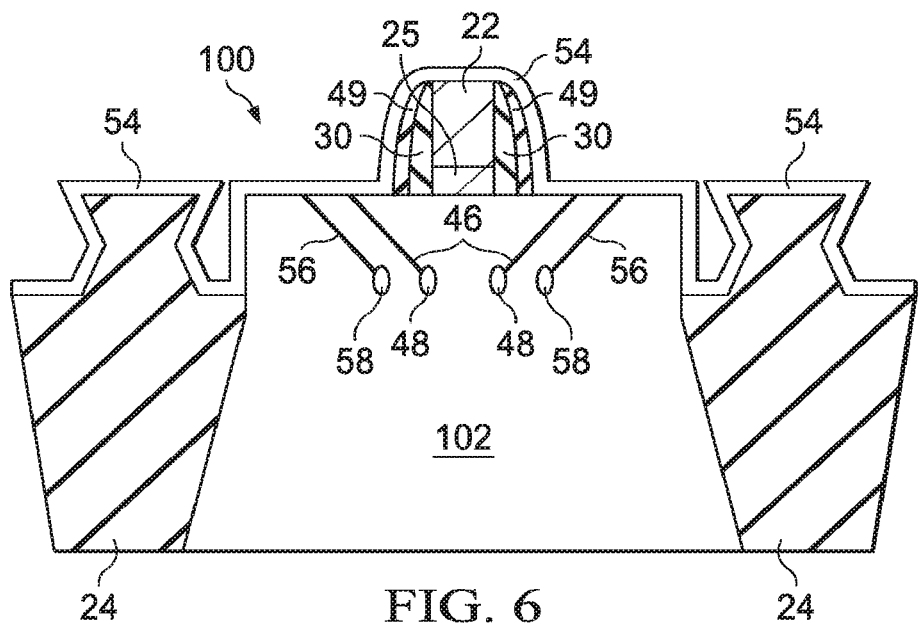

FIG. 6 illustrates the formation of second strained capping layer 54. The candidate materials and formation methods of strained capping layer 54 may be essentially the same as that are used for forming strained capping layer 42. After the formation of strained capping layer 54, a second annealing is performed. Similarly, the second annealing may be essentially the same as the first annealing shown in FIG. 3. As a result of the second annealing, recrystallization occurs in PAI regions 50, and dislocation planes 56 are generated. In the meantime, since the crystalline structure in the bottom portions 46A of dislocation planes 46 were not destroyed by the second PAI, the crystalline structure in the destroyed portions of dislocation planes 46 regrow in PAI region 50, which are converted to crystalline regions again. In the resulting structure as in FIG. 6, two dislocation planes 46 and 56 coexist, and are parallel to each other, with dislocation planes 56 being on the outer sides of the respective dislocation planes 46. Furthermore, pitch-off lines 48 and 58 of respective dislocation planes 46 and 56 are higher than recessed STI top surfaces 24B of STI regions 24. Alternatively stated, pitch-off lines 48 and 58 may be higher than the bottoms of the respective fins 20, which fin bottoms are at the same level as recessed STI top surfaces 24B of STI regions 24.

Figure 7:
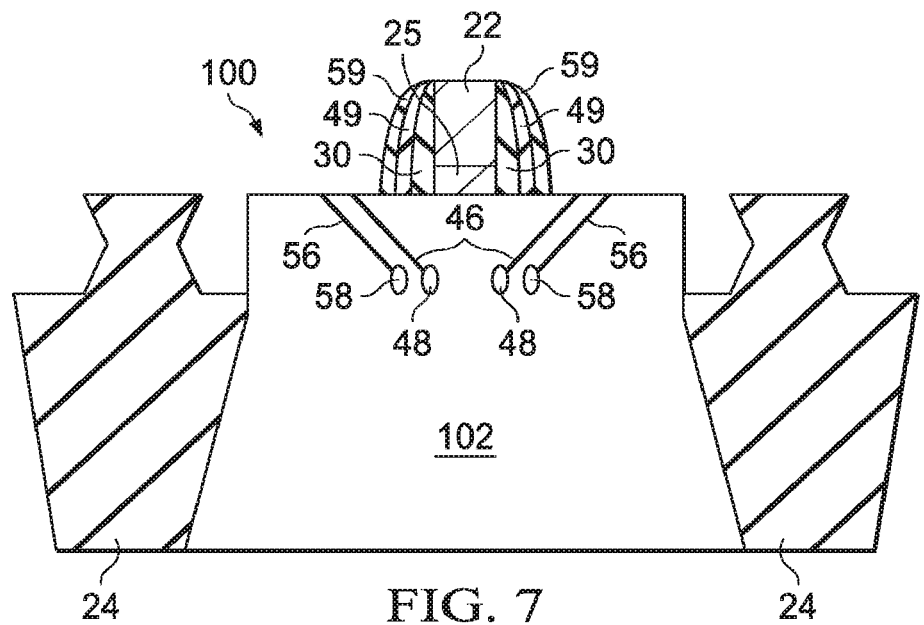
Figure 8:
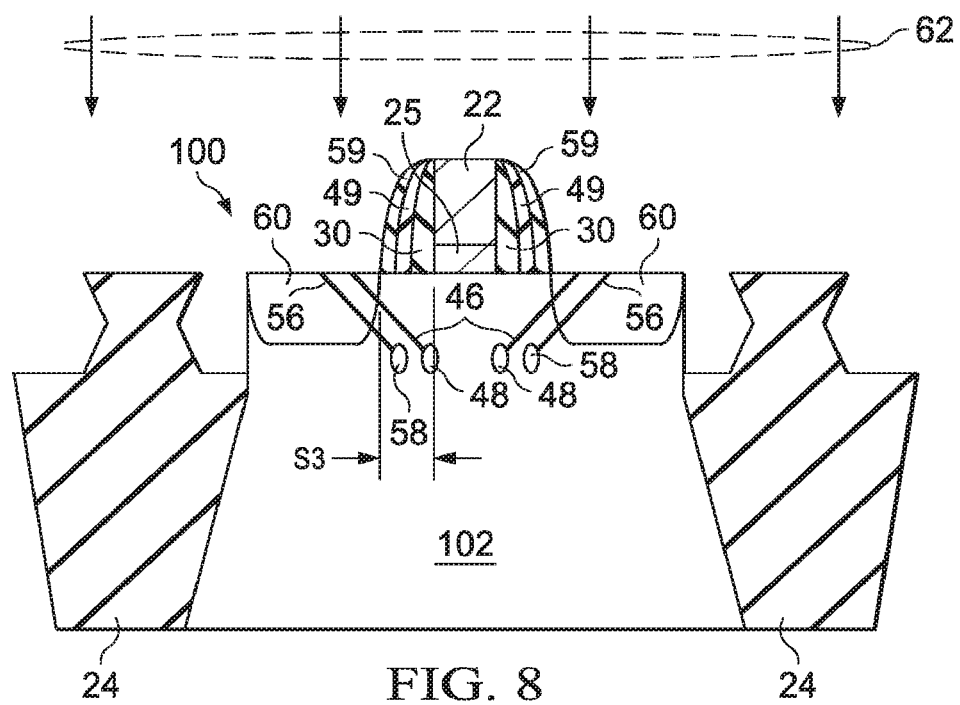

Next, as shown in FIG. 7, an etch step is performed, so that the horizontal portions of strained capping layer 54 are removed, while some vertical portions of strained capping layer 54 are left on offset spacers 49 to form offset spacer 59. In subsequent process steps as shown in FIG. 8, a third PAI 62 is performed to form third PAI regions 60. The third PAI may be essentially the same as the second PAI in FIG. 5. Again, each of dislocation planes 46 and 56 has a bottom portion not overlapped with PAI regions 60, and the crystalline structure in the bottom portions of dislocation planes 46 and 56 are not destroyed during the third PAI 62. The process details of the third PAI 62 may be essentially the same as the second PAI 52 (FIG. 5). Due to the addition of offset spacers 49 and 59, PAI regions 60 are farther away from gate electrode 22 than PAI region 50 (FIG. 5), with spacing S3 greater than spacing S1 and spacing S2, as shown in FIGS. 2 and 5, respectively.

Figure 9:
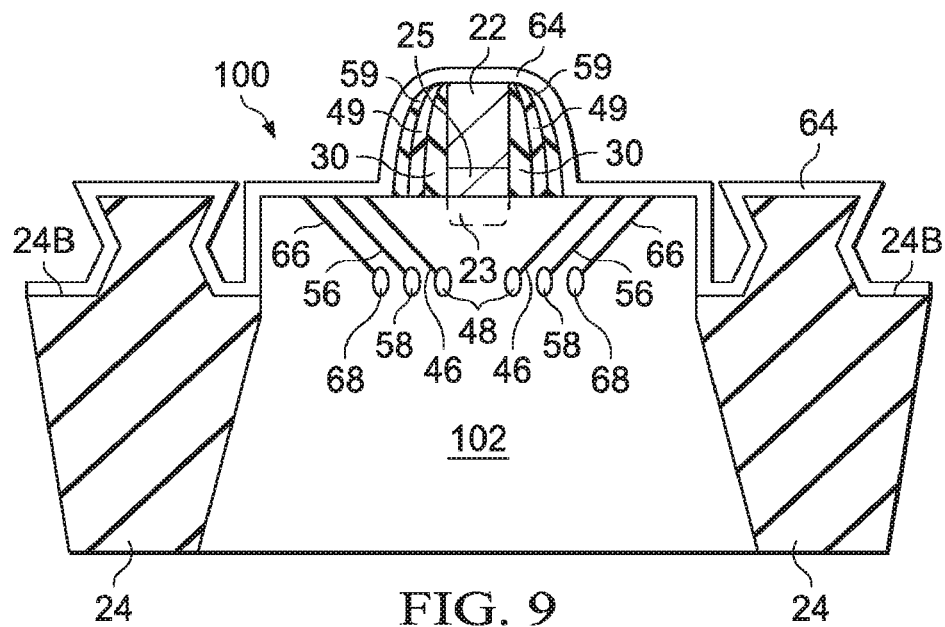

Referring to FIG. 9, a third strained capping layer 64 is formed, followed by a third annealing step to form dislocation planes 66 on the outer sides of dislocation planes 46 and 56. Furthermore, dislocation planes 46, 56 and 66 are parallel to each other. The pitch-off lines 68 of dislocation planes 66 may be higher than recessed top surfaces 24B of STI regions 24.

The formation of dislocation planes 46, 56, and 66 may cause an increase in the tensile stress in channel region 23 of MOSFET 100. The formation of more dislocation planes may cause the tensile stress to be further increased. Simulation has been made to study the relationship between the channel stress and the number of dislocation planes in MOS devices. The results indicated that the channel stress of MOSFETs with two dislocation planes (on each side of gate electrode 22) is 1.5 times the channel stress of MOSFETs that have one dislocation plane, and the channel stress of MOSFETs with three dislocation planes is 1.7 times the channel stress of MOSFETs with two dislocation planes. Therefore, forming more dislocation planes may effectively increase the channel stresses in the respective MOSFETs.

FIGS. 2 through 9 illustrate the formation of a MOSFET with three dislocation planes. In alternative embodiments, a MOSFET may have two dislocation planes or more than three dislocation planes on each side of the gate electrode.

Figure 10:
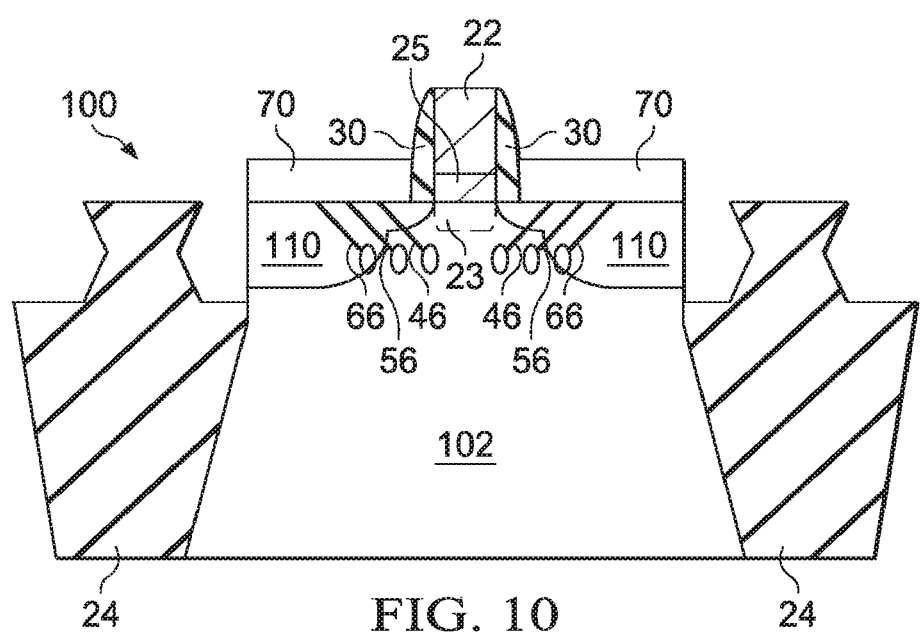

Referring to FIG. 10, strained capping layer 64 and offset spacers 49 and 59 are removed. The removal of offset spacers 49 and 59 may be performed using $H_3PO_4$ when strained capping layer 64 and offset spacers 49 and 59 comprise silicon nitride, for example. Source/drain regions 110 are also formed by an implantation. An epitaxial growth may then be performed to grow epitaxy semiconductor layer 70 on the top surface of source/drain regions 110. In an embodiment, epitaxy semiconductor layer 70 comprises silicon, silicon phosphorus, silicon carbon phosphorus, or the like.

Figure 11:
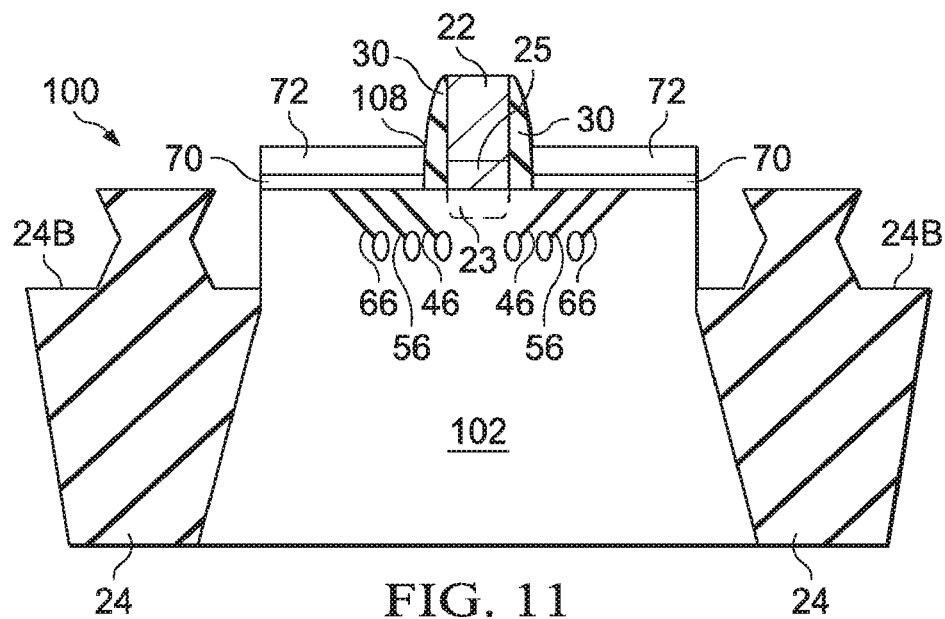

Next, as shown in FIG. 11, a silicidation is performed to form silicide regions 72. In an embodiment, the top portions of epitaxy semiconductor layer 70 are consumed in the silicidation, while the bottom portions of epitaxy semiconductor layer 70 are not consumed in the silicidation. Accordingly, the bottom surfaces of the resulting silicide regions 72 are higher than the top surface of the channel region 23 of MOSFET 100. Simulation results have indicated that when the bottom surface of silicide regions 72 are higher than the top surface of channel region 23, the drive current of MOSFET 100 may be improved, and the improvement increases when the bottom surfaces of silicide regions are higher.

Figure 12:
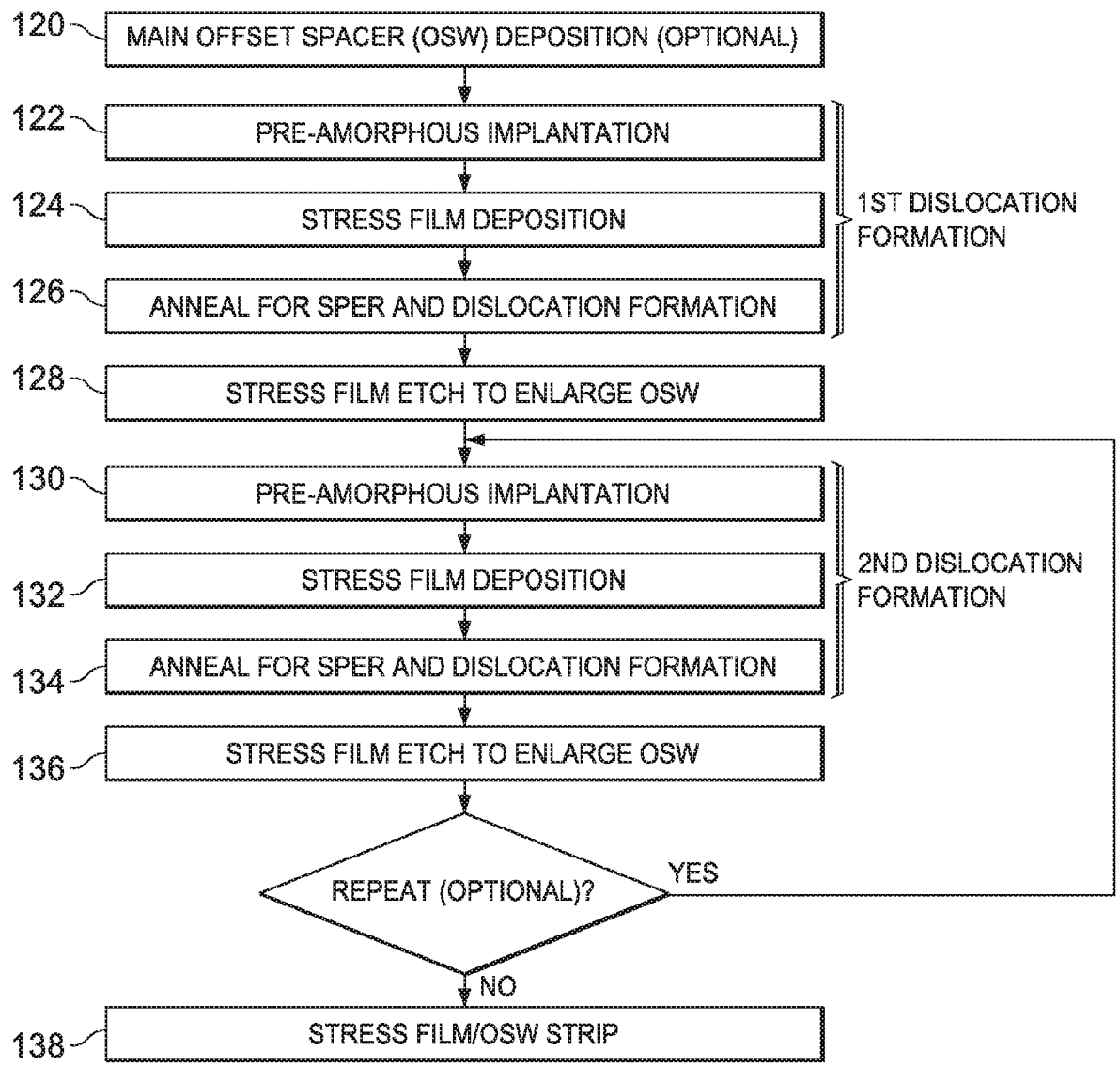
FIG. 12 is a process flow in accordance with embodiments.

FIG. 12 illustrates an exemplary process flow for forming dislocations. First, main offset spacers are formed (step 120). Step 120 in FIG. 12 may correspond to the step shown in FIG. 2. The first dislocation formation is then performed by steps 122, 124, and 126. In step 122, a pre-amorphous implantation is performed, followed by the stress film deposition and the anneal for forming dislocations, as in steps 124 and 126. Steps 122, 124, and 126 may correspond to the steps shown in FIGS. 2 through 4. Next, the stress film is etched to enlarge the size of offset spacers. This step may correspond to the etch step in FIG. 4. A second dislocation formation is performed by steps 130, 132, 134, and 136. In step 130, an additional pre-amorphous implantation is performed, followed by an additional stress film deposition and an additional anneal for forming dislocations (steps 132 and 134). In step 136, the additional stress film is etched to enlarge the size of the offset spacers. Steps 130, 132, 134, and 136 may correspond to the steps shown in FIGS. 5 through 7. Steps 130, 132, 134, and 136 may be repeated one more time or a plurality of times. For example, the steps shown in FIGS. 8 and 9 illustrate an exemplary repetition of steps 130, 132, 134, and 136. Step 138 illustrates the removal of stress films and optional main offset sidewall spacers. Step 138 may correspond to the exemplary step shown in FIG. 10.

FIGS. 13 through 21C illustrate cross-sectional views of intermediate stages in the formation of a MOSFET in accordance with alternative embodiments. Unless specified otherwise, the materials and the formation methods of the components in these embodiments are essentially the same as their like components, which are denoted by like reference numerals in the embodiments shown in FIGS. 1 through 12. The details regarding the formation process and the materials of the components shown in FIGS. 13 through 21C may thus be found in the discussion of the embodiments shown in FIGS. 1 through 12.

Figure 13:
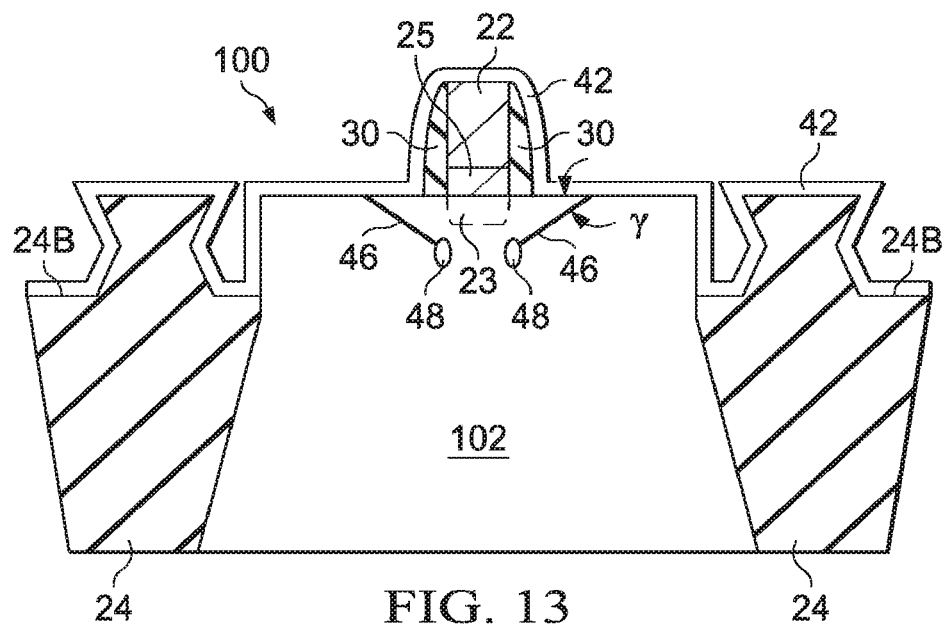
FIGS. 13 through 21C are cross-sectional views of intermediate stages in the manufacturing of MOSFETs in accordance with alternative embodiments.

The initial structure and formation steps of these embodiments are essentially the same as shown in FIG. 2, wherein PAI regions 40 are formed. Next, FIG. 13 illustrates the formation of a first strained capping layer 42. The materials of strained capping layer 42 may include silicon nitride, titanium nitride, oxynitride, oxide, SiGe, SiC, SiON, and combinations thereof. Strained capping layer 42 also comprises hydrogen in addition to other materials. For example, strained capping layer 42 may be a hydrogen-containing silicon nitride, a hydrogen-containing titanium nitride, a hydrogen-containing silicon oxide, a hydrogen-containing silicon oxynitride, a hydrogen-containing SiGe, a hydrogen-containing SiC, a hydrogen-containing SiON, combinations thereof, or multi-layers thereof.

In the formation of hydrogen-containing strained capping layer 42, the process gases include hydrogen ($H_2$) in addition to other process gases. For example, when strained capping layer 42 comprises silicon nitride, the process gases may include silane ($SiH_4$) (or $SiCl_4$), ammonia ($NH_3$), and hydrogen. The deposition temperature may be between about 400° C. and about 500° C. The process gases have a pressure of about 1 torr to about 15 torr. The resulting strained capping layer 42 thus comprises hydrogen therein. In some exemplary embodiments, the flow rate of hydrogen is higher than about 100 sccm in the deposition of strained capping layer 42 in order to increase the hydrogen concentration in hydrogen-containing strained capping layer 42. In alternative embodiments, strained capping layer 42 is formed first. The strained capping layer 42 may be hydrogen-free or hydrogen-containing. After the formation of strained capping layer 42, an additional diffusion process is performed to incorporate (more) hydrogen into strained capping layer 42 and to further increase the hydrogen concentration in strained capping layer 42. In the resulting hydrogen-containing strained capping layer 42, the concentration of hydrogen may be greater than about $1E19/cm^3$, greater than about $1E20/cm^3$, or greater than about $1E19/cm^3$.

An anneal is then performed, for example, using RTA, thermal spike RTA anneal, or other anneal methods. The annealing temperature may be between about 400° C. and about 500° C. The annealing may be performed in an environment conducted with processes such as $O_2$, $N_2$, $H_2$, and the like. The process gases have a pressure of about 1 torr to about 15 torr. In addition, in the annealing, hydrogen-containing strained capping layer 42 is exposed to a Ultra-Violet (UV) light. As a result of the anneal, PAI regions 40 as in FIG. 2 are recrystallized with a memorized stress obtained from strained capping layer 42. Accordingly, semiconductor substrate 102 may apply a tensile stress to channel region 23 of the resulting MOSFET 100 so that the drive current of MOSFET 100 is improved.

As the result of the annealing, dislocation planes 46 are formed. In accordance with some embodiments, due to the formation of hydrogen-containing strained capping layer 42, in the anneal, hydrogen outgases from hydrogen-containing strained capping layer 42. The UV light, for example, helps the outgasing. This causes the growth rates of the Solid Phase Epitaxial-Phase Regrowth (SPER) on different crystal planes to differ from the growth rates in the embodiments in FIG. 3. For example, in the embodiments shown in FIG. 3, the growth rate from the (100) plane of semiconductor substrate 102 may be greater than the growth rate from the (110) plane of semiconductor substrate 102, which results in angle β (FIG. 3) of dislocation planes 46 being relatively large, which may be about 55 degrees. In the embodiments shown in FIG. 13, the growth rate from the (100) plane of semiconductor substrate 102 is reduced, for example, to be lower than the growth rate from the (110) plane of semiconductor substrate 102, which causes angle γ (FIG. 13) of dislocation planes 46 to be relatively small (smaller than about 65 degrees). In some embodiments, angle γ is smaller than about 45 degrees and is in the range of 0 degrees to about 45 degrees. Angle γ may also be in the range from about 20 degrees to about 40 degrees. In some exemplary embodiments, angle γ is about 35 degrees. Advantageously, a small angle γ results in a higher stress applied to channel region 23. Accordingly, it is desirable to reduce the angle γ of dislocation planes 46.

The bottom points 48 of dislocation planes 46 may be higher than recessed top surfaces 24B of STI regions 24. This may minimize the impact of STI regions 24, which adversely apply a compressive stress to channel 23. Bottom points 48 form lines extending in the Y direction in FIG. 1 and hence are referred to as pinch-off lines 48 hereinafter.

Figure 14:
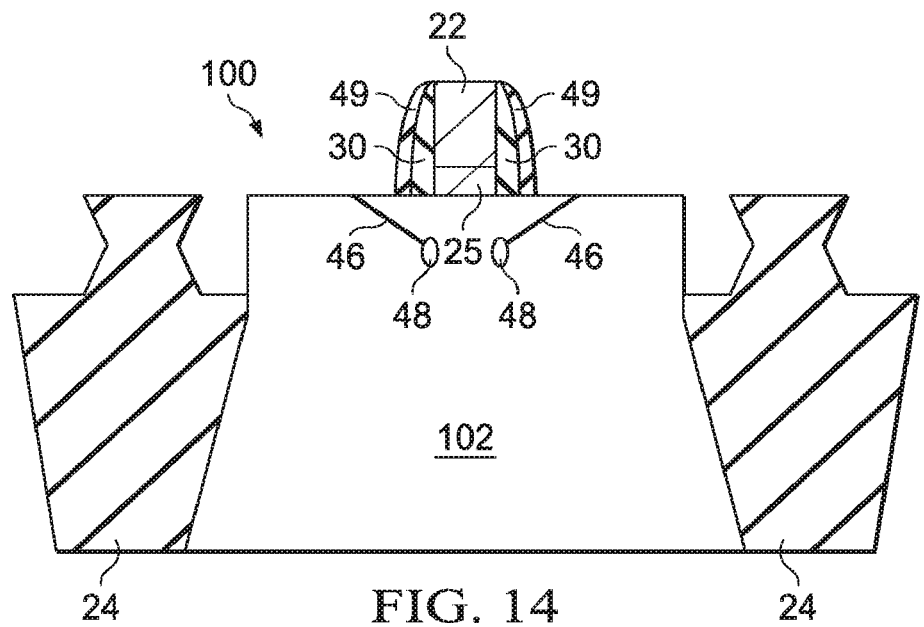

Next, an etch step is performed, and the horizontal portions of strained capping layer 42 are removed while some of the vertical portions of strained capping layer 42 remain to form offset spacers 49 as in FIG. 14. Again, offset spacers 49 are on the sidewalls of main offset sidewall spacers 30 or on the sidewalls of gate electrode 22 if main offset sidewall spacers 30 are not formed. It is noted that the remaining portions of strained capping layer 42 may (or may not) also include portions on the sidewalls of substrate 102 and STI regions 24, and these portions are not illustrated.

Figure 15:
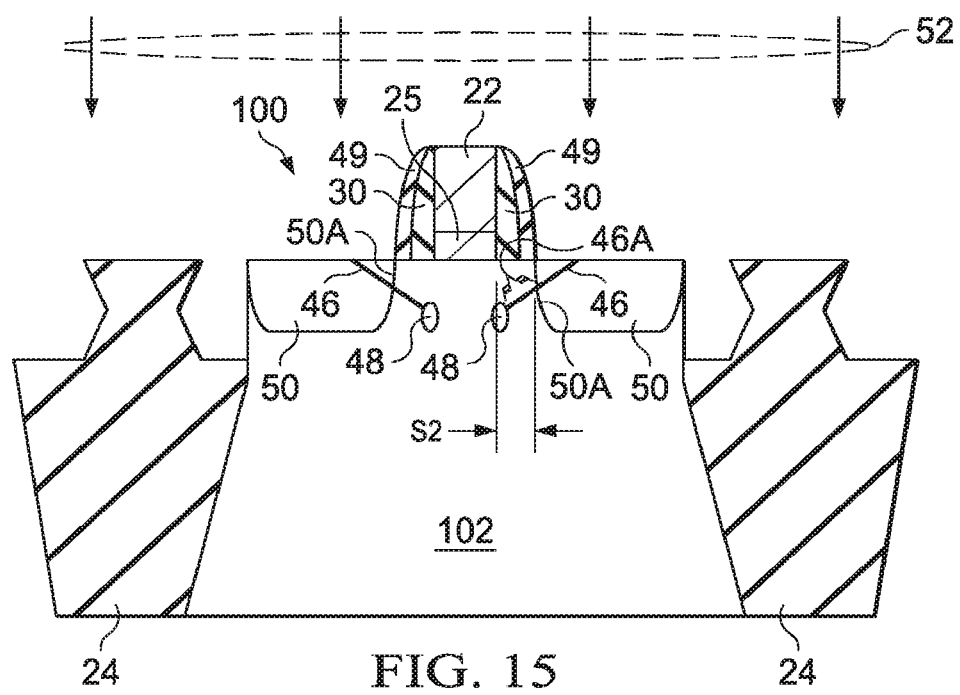

FIG. 15 illustrates the formation of second PAI regions 50 through a second PAI implantation, which PAI implantation is illustrated using arrows 52. The second PAI implantation is performed with offset spacers 49 blocking some of the implanted elements. Accordingly, inner edges 50A of PAI regions 50 are farther away from the respective gate electrode 22 than the respective PAI regions 40 (FIG. 2). Alternatively stated, horizontal spacing S2 (FIG. 15), which is the spacing between the inner edges of PAI regions 50 and the respective nearest edges of gate electrode 22, is greater than horizontal spacing S1 in FIG. 2. Furthermore, at least a bottom portion 46A of each of dislocation planes 46 is not located inside the newly formed PAI regions 50. This may be achieved by making PAI regions 50 shallower than pinch-off lines 48. Alternatively, this is achieved by using offset spacers 49 in the second PAI to space PAI regions 50 away from gate electrode 22, as illustrated in FIG. 15. The crystalline structure in the portions of dislocation planes 46 that overlap PAI regions 50 are destroyed since PAI regions 50 are amorphous regions. The implantation process may be similar to the implantation process discussed, referring to FIG. 5.

Figure 16A:
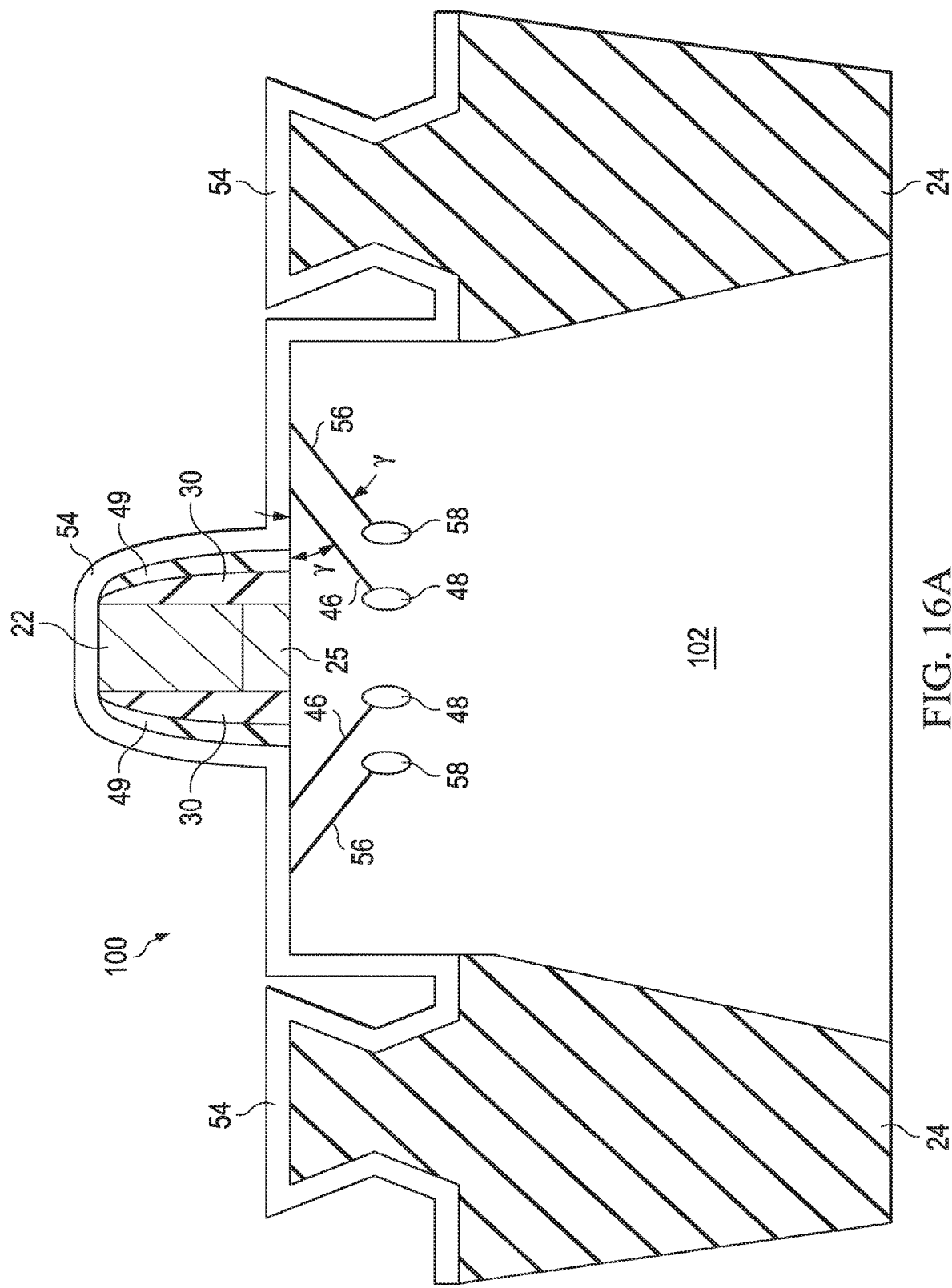

FIG. 16A illustrates the formation of second strained capping layer 54. The candidate materials and formation methods of strained capping layer 54 may be essentially the same as those used for forming strained capping layer 42. In accordance with some embodiments, strained capping layer 54 comprises hydrogen, which may be incorporated into strained capping layer 54 during and/or after its formation. In alternative embodiments, strained capping layer 54 is hydrogen free or substantially hydrogen free.

After the formation of strained capping layer 54, a second annealing is performed. The second annealing may use essentially the same process conditions as those used in the first annealing shown in FIG. 13 or different process conditions from those used the first annealing shown in FIG. 13. As a result of the second annealing, recrystallization occurs in PAI regions 50, and dislocation planes 56 are generated. In the meantime, since bottom portions 46A (FIG. 14) of dislocation planes 46 were not destroyed by the second PAI, the destroyed portions of dislocation planes 46 regrow in PAI region 50, which are converted to crystalline regions again. In the resulting structure FIG. 16A, dislocation planes 46 and 56 coexist and may be parallel to each other, with dislocation planes 56 being on the outer sides of the respective dislocation planes 46. Furthermore, pitch-off lines 48 and 58 of the respective dislocation planes 46 and 56 are higher than recessed STI top surfaces 24B of STI regions 24. Alternatively stated, pitch-off lines 48 and 58 may be higher than the bottoms of the respective fins 20, the bottoms of which are at the same level as recessed STI top surfaces 24B of STI regions 24.

Figure 16B:
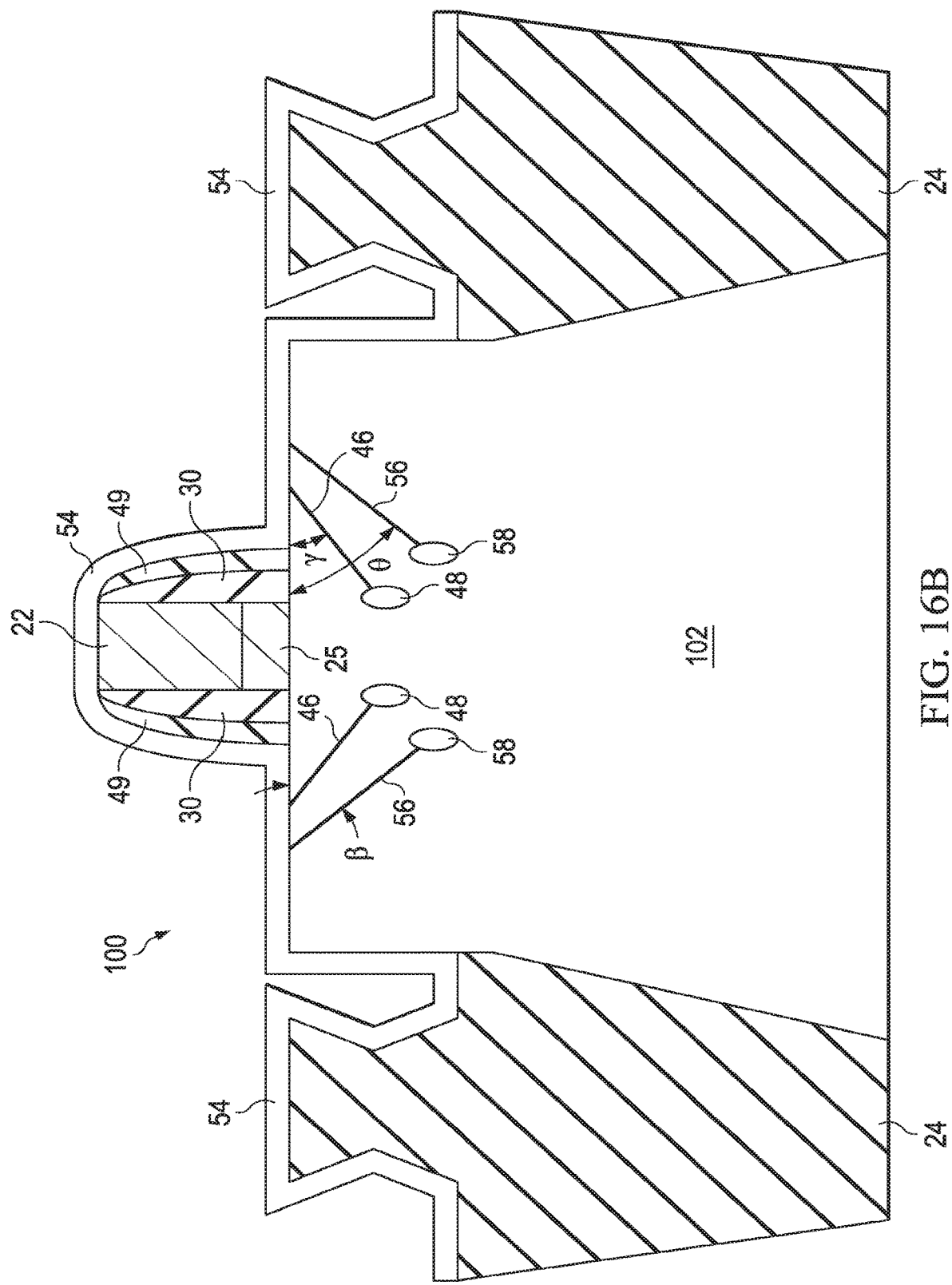

In accordance with some embodiments in which strained capping layer 54 is a hydrogen-containing layer, the resulting dislocation planes 56 have tilt angle γ, which may be the same as or different from the angle γ of dislocation planes 46. Hence, dislocation planes 46 may or may not be parallel to the corresponding dislocation planes 56. In alternative embodiments, as shown in FIG. 16B, dislocation planes 56 may have angle θ greater than angle γ. In some embodiments, angle θ is equal to angle β as in FIG. 3. The difference between angles θ and γ may be achieved by making the respective strained capping layer 54 hydrogen-free or substantially hydrogen-free.

Figure 16C:
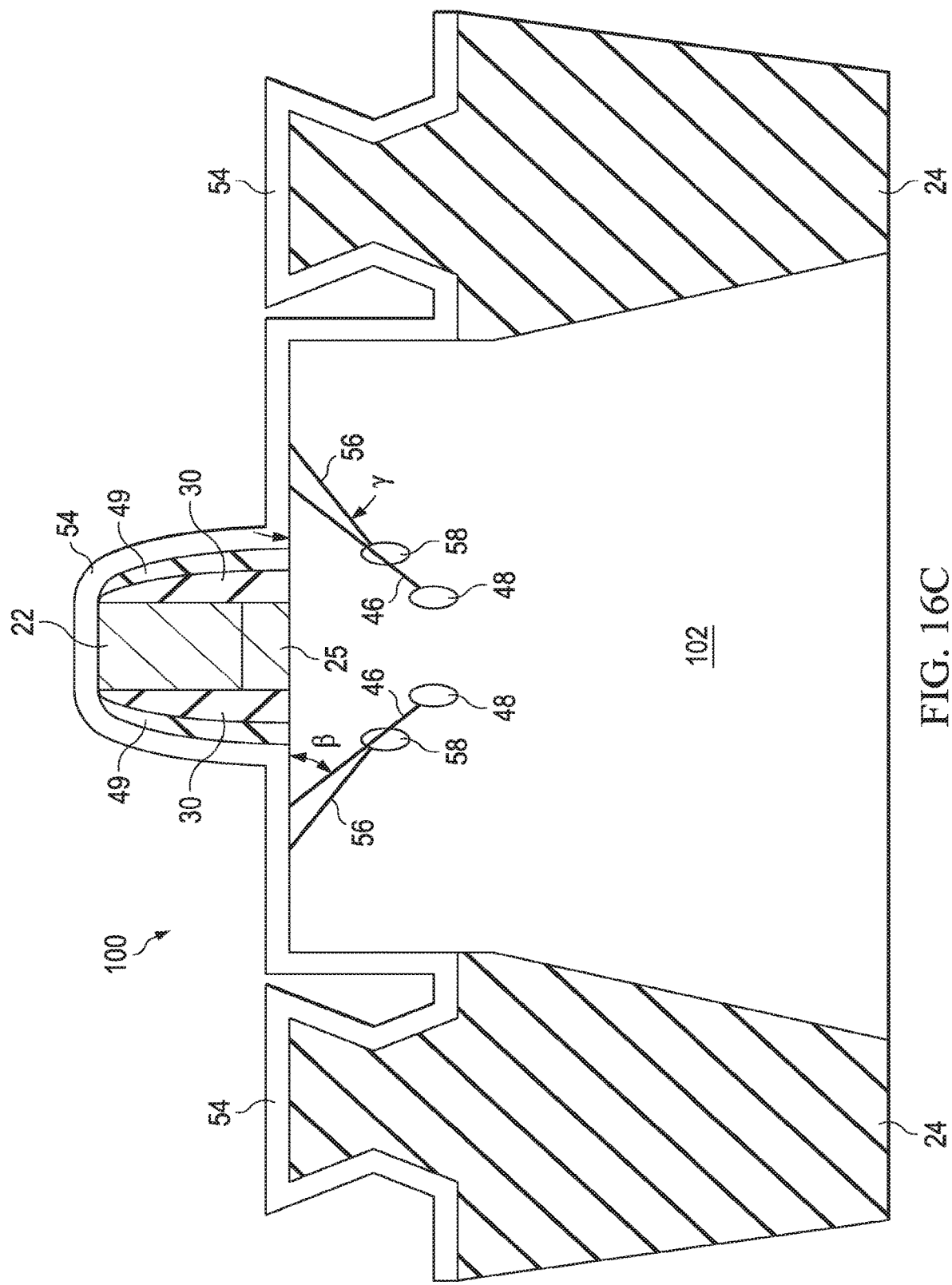

FIG. 16C illustrates the cross-sectional view of an alternative embodiment, wherein the tilt angle of dislocation planes 56 is smaller than the tilt angle of dislocation planes 46. In accordance with some exemplary embodiments, the tilt angle of dislocation planes 56 is γ, and the tilt angle of dislocation planes 46 is β. In these embodiments, dislocation planes 56 may or may not contact dislocation planes 46.

Figure 17:
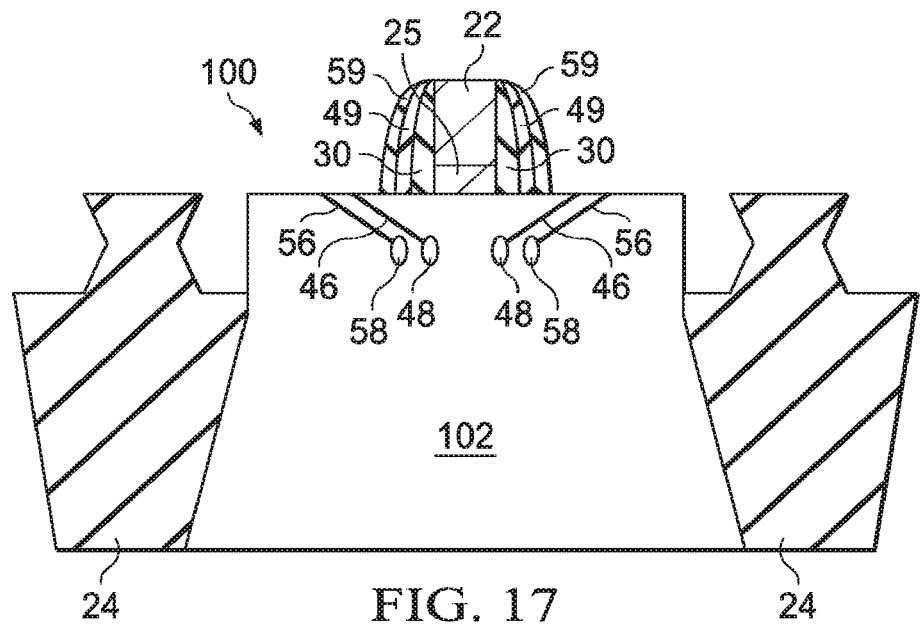
Figure 18:
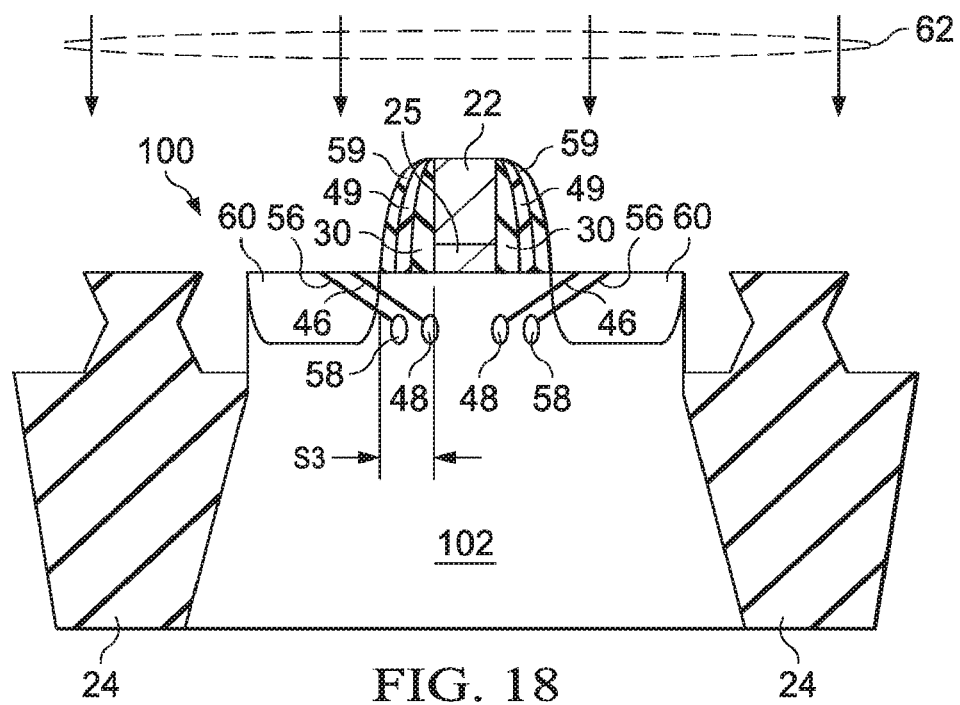

Next, as shown in FIG. 17, an etch step is performed so that the horizontal portions of strained capping layer 54 are removed, while some vertical portions of strained capping layer 54 are left on offset spacers 49 to form offset spacer 59. In subsequent process steps as shown in FIG. 18, a third PAI 62 is performed to form third PAI regions 60. The third PAI may be essentially the same as the second PAI in FIG. 15. Again, each of dislocation planes 46 and 56 has a bottom portion not overlapped with PAI regions 60, and the crystalline structure of the bottom portions of dislocation planes 46 and 56 are not destroyed during the third PAI 62. The process details of the third PAI 62 may be essentially the same as the second PAI 52 (FIG. 15).

Due to the addition of offset spacers 49 and 59, PAI regions 60 are farther away from gate electrode 22 than PAI region 50 (FIG. 5), with spacing S3 greater than spacing S1 and spacing S2, as shown in FIGS. 2 and 15, respectively.

Figure 19:
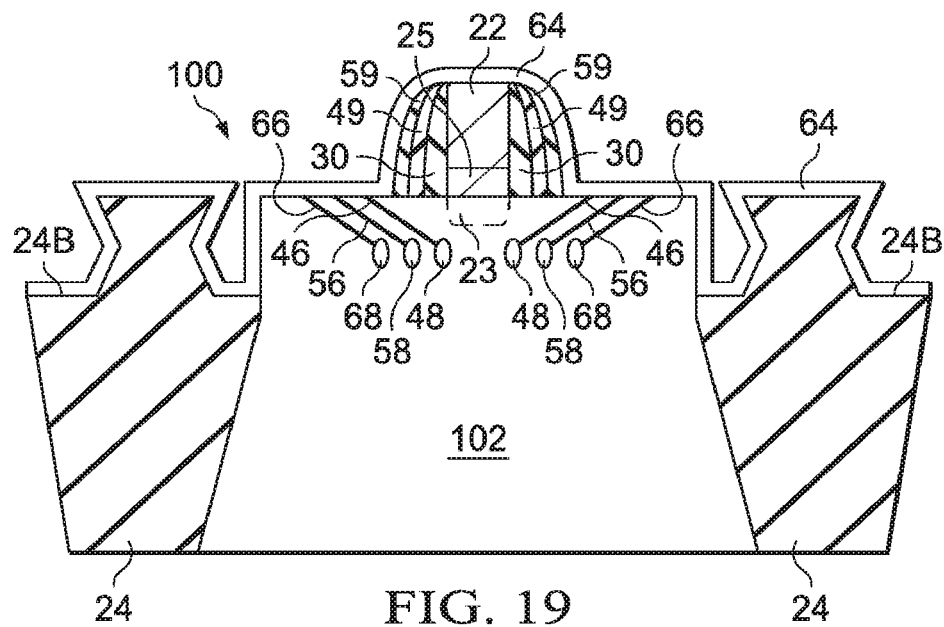

Referring to FIG. 19, a third strained capping layer 64 is formed, followed by a third annealing step to form dislocation planes 66 on the outer sides of dislocation planes 46 and 56. Furthermore, dislocation planes 46, 56, and 66 may or may not be parallel to each other. The pitch-off lines 68 of dislocation planes 66 may be higher than recessed top surfaces 24B of STI regions 24. In accordance with some embodiments, strained capping layer 64 is hydrogen-containing. In alternative embodiments, strained capping layer 64 is hydrogen-free. As a result, the angle of strained capping layer 64 may be either in the range of about 45 degrees to 90 degrees or in the range of 0 degrees to about 45 degrees.

Figure 20:
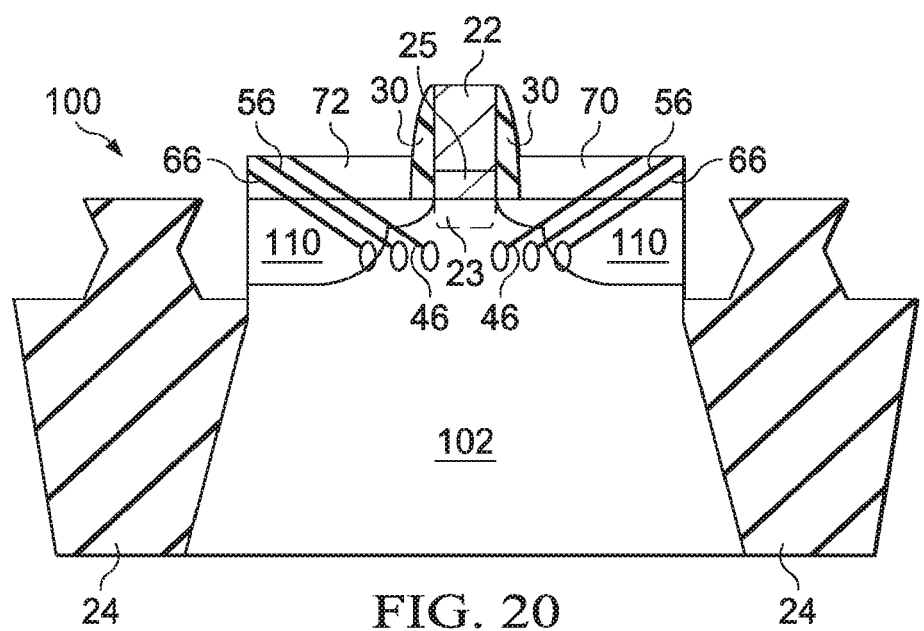

Referring to FIG. 20, strained capping layer 64 and offset spacers 49 and 59 are removed. An epitaxial growth may then be performed to grow epitaxy semiconductor layer 70 on the top surface of source/drain regions 110. Source/drain regions 110 are also formed by implantation. Dislocation planes 46, 56, and 66 may grow into epitaxy semiconductor layer 70. Epitaxy semiconductor layer 70 may comprise silicon, silicon phosphorus, silicon carbon phosphorus, or the like.

Figure 21A:
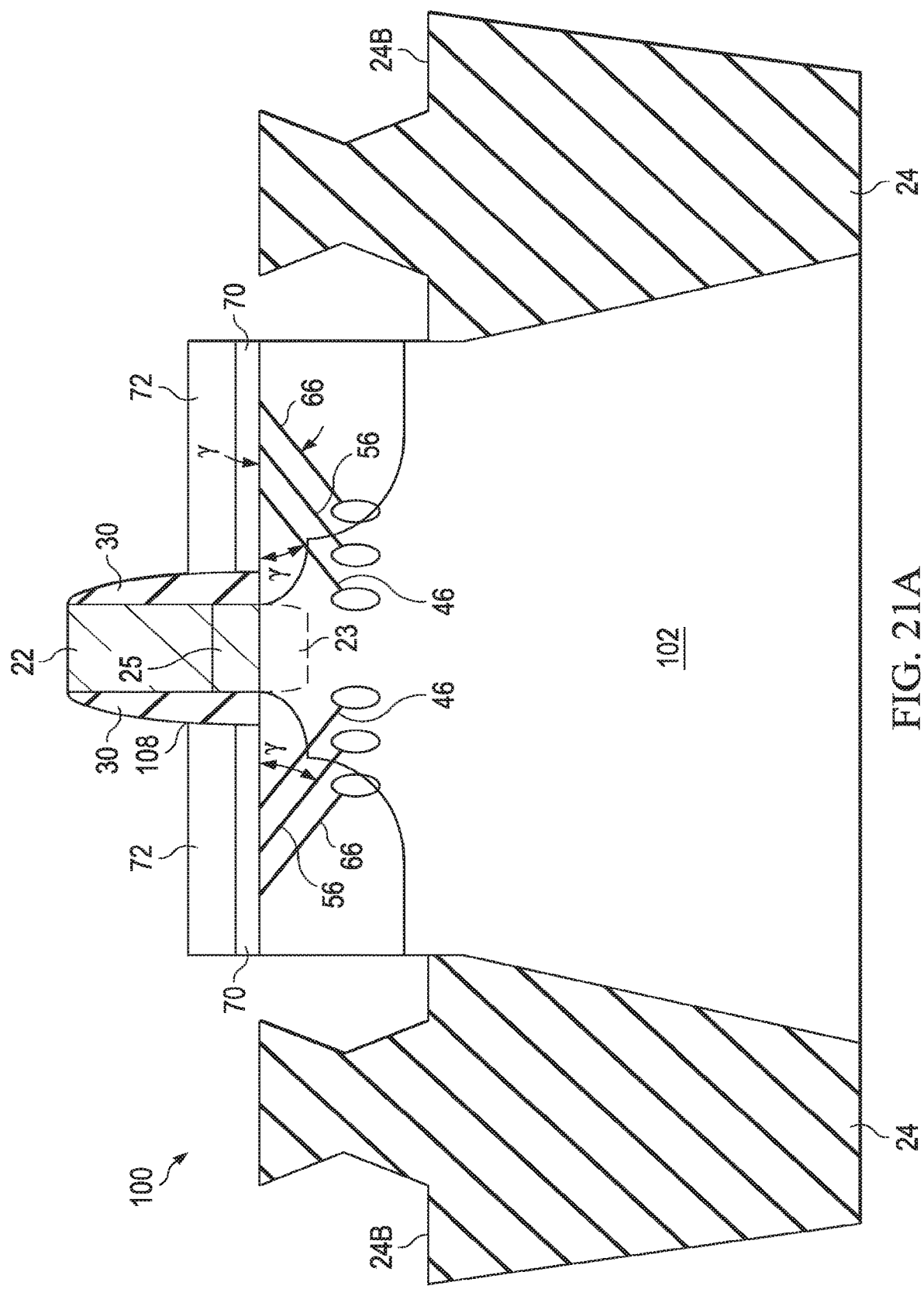
Figure 21B:
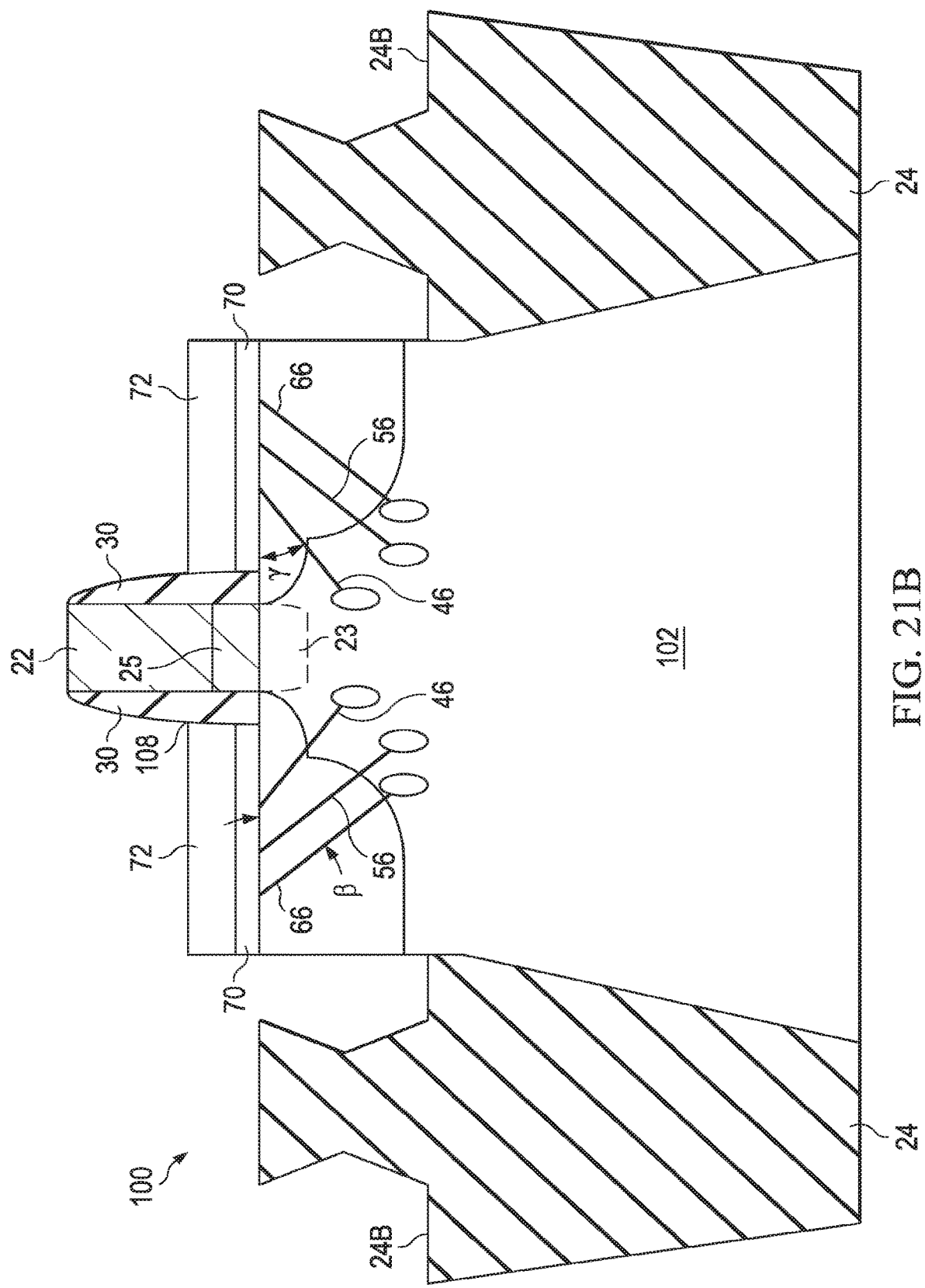
Figure 21C:
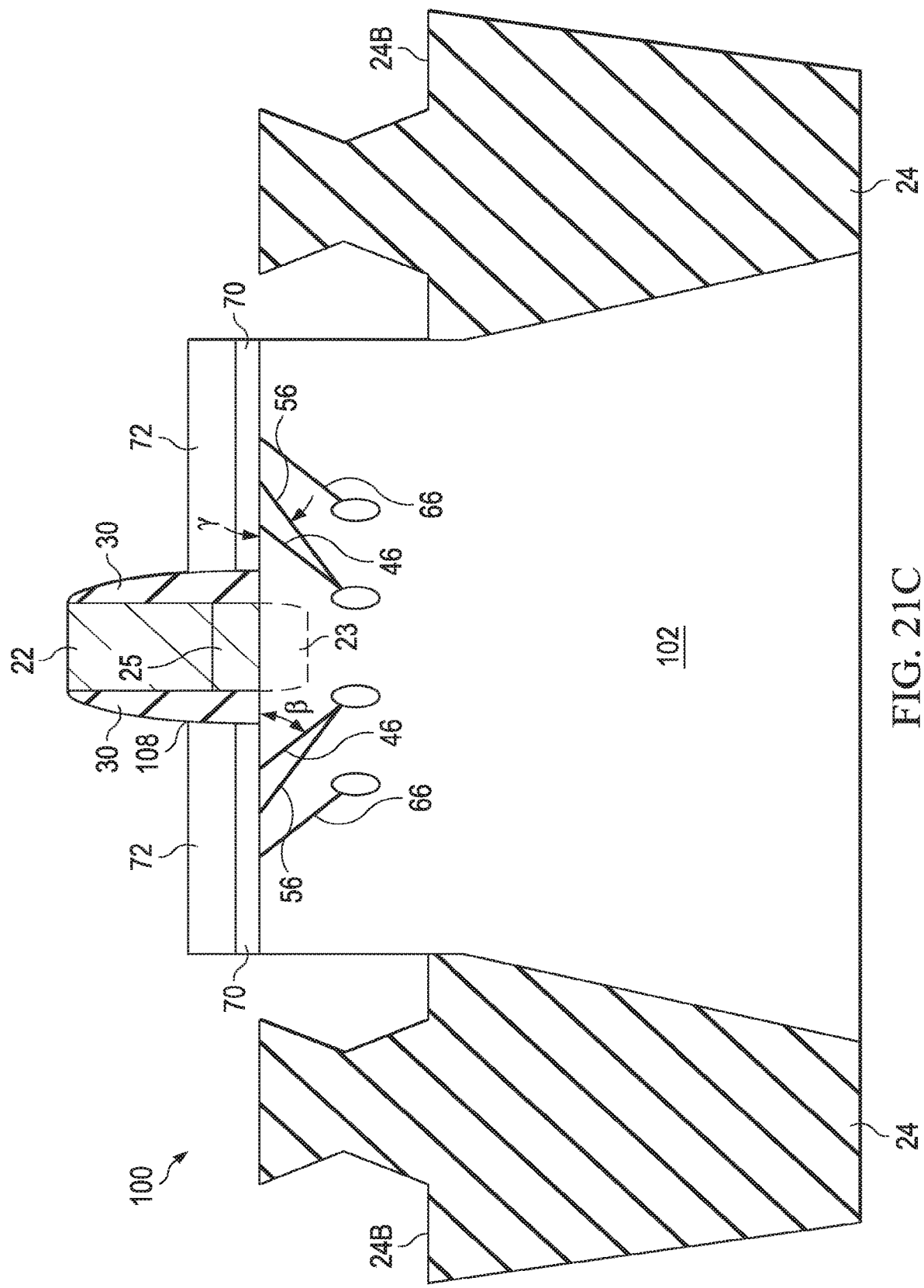

Next, as shown in FIGS. 21A, 21B, and 21C, a silicidation is performed to form silicide regions 72. The silicidation process and the respective details are essentially the same as those in the embodiments in FIG. 11 and are not repeated herein.

FIGS. 21A, 21B, and 21 illustrate various embodiments of the present disclosure. Each of the dislocation planes may have its own tilt angle (such as β, γ, and θ), which may be the same as or different from the tilt angles of the other dislocation planes. The different angles may be achieved by adjusting the hydrogen concentration in the respective strained capping layers, and the higher the hydrogen concentration is, the smaller the tilt angle is. Furthermore, the amount of hydrogen needs to reach a certain amount in order to reduce the tilt angle. For example, FIG. 21A illustrates that dislocation planes 46, 56, and 66 have the same tilt angle γ. In alternative embodiments, as shown in FIG. 21B, dislocation planes 46 have smaller tilt angles (such as γ) than the tilt angle (such as β) of the outer dislocation planes 56 and 66. In yet alternative embodiments, as shown in FIG. 21C, dislocation planes 46 have greater tilt angles (such as β) than the tilt angles (such as γ) of the outer dislocation planes 56 and 66. In accordance with some embodiments, the outer dislocation planes (such as dislocation planes 56 or 66) may contact the inner dislocation planes (such as dislocation planes 46 or 56), as shown in FIG. 21C. In other embodiments, the outer dislocation planes are not in contact with the inner dislocation planes although the outer dislocation planes have smaller tilt angles than the inner dislocation planes.

The embodiments of the present disclosure have some advantageous features. By forming a plurality of dislocation planes, the strains in the channel region of the MOSFET is increased. The manufacturing cost of the process in accordance with the embodiments of the present disclosure is low since the strained capping layers are also used as the spacers for defining the locations of the dislocation planes. In addition, by incorporating hydrogen in the strained capping layers, the tilt angles of the dislocation planes are reduced, resulting in further increase in the strain applied to the channel region of the MOSFET.

In accordance with some embodiments of the present disclosure, a method includes forming a MOSFET. The Method includes performing an implantation to form a PAI region adjacent to a gate electrode of the MOSFET, forming a strained capping layer over the PAI region, and performing an annealing on the strained capping layer and the PAI region to form a dislocation plane. The dislocation plane is formed as a result of the annealing, with a tilt angle of the dislocation plane being smaller than about 65 degrees.

In accordance with alternative embodiments of the present disclosure, a method includes performing an implantation to form a PAI region adjacent to a gate electrode of a MOSFET, and forming a strained capping layer over the PAI region, with hydrogen used as a process gas in the forming the strained capping layer. The method further includes performing an annealing on the strained capping layer and the PAI region to form a dislocation plane. The dislocation plane is formed as a result of the annealing.

In accordance with yet alternative embodiments of the present disclosure, a MOSFET includes a semiconductor region, a gate electrode including a portion over the semiconductor region, and a dislocation plane adjacent to the gate electrode and in the semiconductor region. The dislocation plane has a tilt angle smaller than about 65 degrees.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
performing a first implantation process on a semiconductor region to form a first pre-amorphization implantation (PAI) region adjacent to a gate stack;
forming a first strained capping layer over the first PAI region, wherein the first strained capping layer is formed using a process gas comprising hydrogen ($H_2$);
performing a first annealing to recrystallize the first PAI region and to form a first dislocation plane, wherein the first annealing is performed with the first strained capping layer being over the first PAI region;
performing a second implantation process on the semiconductor region to form a second PAI region;
forming a second strained capping layer over the second PAI region, wherein the second strained capping layer is performed using processes free from hydrogen; and
performing a second annealing to recrystallize the second PAI region and to form a second dislocation plane, wherein the first dislocation plane and the second dislocation plane are separated from each other, and wherein the second annealing is further performed with the second strained capping layer being over the second PAI region.

2. The method of claim 1, wherein the first dislocation plane and the second dislocation plane both extend into a source/drain region, and are un-parallel to each other, with both having upper portions spaced further away from a middle vertical line of the gate stack than respective lower portions.

3. The method of claim 1, wherein the first dislocation plane and the second dislocation plane have different tilt angles, and both of the first dislocation plane and the second dislocation plane having a portion extending into a same source/drain region in the semiconductor region.

4. The method of claim 1 further comprising etching the first strained capping layer to form an offset spacer, wherein the second strained capping layer is formed over the offset spacer.

5. The method of claim 4 further comprising:
removing the offset spacer; and
after the offset spacer is removed, forming a source/drain region extending into the semiconductor region.

6. The method of claim 1, wherein the first strained capping layer comprises an upper portion in a source/drain region in the semiconductor region, and a lower portion outside of the source/drain region.

7. The method of claim 6, wherein the lower portion is directly underlying a gate spacer on a sidewall of the gate stack.

8. The method of claim 1, wherein the first dislocation plane and the second dislocation plane are on a same side of the gate stack, and the second dislocation plane is further away from the gate stack than the first dislocation plane.

9. The method of claim 8, wherein the first dislocation plane is more tilted than the second dislocation plane, and the first dislocation plane and the second dislocation plane extend into a same source/drain region in the semiconductor region.

10. The method of claim 8, wherein the first dislocation plane is less tilted than the second dislocation plane, and the first dislocation plane and the second dislocation plane extend into a same source/drain region in the semiconductor region.

11. A method comprising:
forming a gate stack;
in a first process, forming a first dislocation plane comprising a portion on a side of the gate stack;
in a second process, forming a second dislocation plane on the side of the gate stack; and
forming a source/drain region on the side of the gate stack, wherein both of the first dislocation plane and the second dislocation plane extend into the source/drain region, wherein each of the first dislocation plane and the second dislocation plane comprises:
an upper portion in the source/drain region, wherein in a cross-sectional view of the source/drain region, the upper portion of the first dislocation plane extends continuously from a top surface of the source/drain region downwardly to penetrate through the source/drain region; and
a lower portion outside of the source/drain region.

12. The method of claim 11, wherein each of the forming the first dislocation plane and the forming the second dislocation plane comprises:
performing an implantation process to form an amorphized region in a semiconductor region and adjacent to the gate stack;
forming a strained capping layer on the gate stack and the amorphized region; and
performing an annealing on the strained capping layer and the amorphized region, wherein the amorphized region is recrystallized.

13. The method of claim 12, wherein the strained capping layer formed during the forming the first dislocation plane comprises hydrogen gas ($H_2$), and the strained capping layer formed during the forming the second dislocation plane is free from hydrogen.

14. The method of claim 11 further comprising an isolation region joining the source/drain region, wherein the first dislocation plane has a bottom end higher than a first top surface of the isolation region.

15. The method of claim 11, wherein the first dislocation plane and the second dislocation plane that both extend into the source/drain region are un-parallel to each other, with both having upper portions spaced further away from a middle vertical line of the gate stack than respective lower portions.

16. The method of claim 11, wherein the lower portion of each of the first dislocation plane and the second dislocation plane is closer to a vertical line extending through a center of the gate stack than the respective upper portion.

17. The method of claim 11, wherein both of the first dislocation plane and the second dislocation plane tilt to a same direction.

18. A method comprising:
forming an isolation region adjacent to a semiconductor region, wherein a first top surface of a first portion of the isolation region is recessed lower than a second top surface of a second portion of the isolation region, and wherein the first portion of the isolation region is between the second portion of the isolation region and semiconductor region;

forming a gate stack over the semiconductor region;

forming a first dislocation plane adjacent to the gate stack, wherein the first dislocation plane has a bottom end higher than the first top surface of the isolation region;

forming a second dislocation plane adjacent to the gate stack, wherein the first dislocation plane and the second dislocation plane are on a same side of the gate stack, and extend into the semiconductor region;

forming a source/drain region extending into the semiconductor region; and annealing the source/drain region to extend the first dislocation plane and the second dislocation plane into the source/drain region.

19. The method of claim 18, wherein the forming the first dislocation plane and the forming the second dislocation plane comprise forming a first strained capping layer and a second strained capping layer, respectively, and wherein the first strained capping layer has a higher hydrogen concentration than the second strained capping layer.

20. The method of claim 19 further comprising anisotropically etching the first strained capping layer and the second strained capping layer to form offset spacers.

* * * * *